(12) United States Patent
Doherty et al.

(10) Patent No.: US 6,853,211 B2
(45) Date of Patent: *Feb. 8, 2005

(54) METHOD AND SYSTEM HAVING SWITCHING NETWORK FOR TESTING SEMICONDUCTOR COMPONENTS ON A SUBSTRATE

(75) Inventors: C. Patrick Doherty, Boise, ID (US); Jorge L. de Varona, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/633,189

(22) Filed: Aug. 1, 2003

(65) Prior Publication Data

US 2004/0021480 A1 Feb. 5, 2004

Related U.S. Application Data (63) Continuation of application No. 10/223,826, filed on Aug. 20, 2002, now Pat. No. 6,677,776, which is a continuation-in-part of application No. 09/675,072, filed on Sep. 28, 2000, now Pat. No. 6,433,574, which is a division of application No. 09/244,373, filed on Feb. 4, 1999, now Pat. No. 6,337,577, which is a continuation-in-part of application No. 09/075,691, filed on May 11, 1998, now Pat. No. 6,246,250.

(51) Int. Cl.[7] .............................................. G01R 31/26
(52) U.S. Cl. ..................................... 324/765; 324/158.1
(58) Field of Search ............................ 324/765, 158.1, 324/754, 755, 758; 438/14, 17, 18, 16; 257/48

(56) References Cited

U.S. PATENT DOCUMENTS

| | | |
|---|---|---|
| 3,806,801 A | 4/1974 | Bove |
| 4,027,935 A | 6/1977 | Byrnes et al. |
| 4,585,991 A | 4/1986 | Reid et al. |
| 4,891,585 A | 1/1990 | Janko et al. |
| 4,906,920 A | 3/1990 | Huff et al. |
| 4,918,383 A | 4/1990 | Huff et al. |
| 4,954,458 A | 9/1990 | Reid |
| 5,042,148 A | 8/1991 | Tada et al. |
| 5,053,700 A | 10/1991 | Parrish |

(List continued on next page.)

*Primary Examiner*—Michael Tokar
*Assistant Examiner*—Jimmy Nguyen
(74) *Attorney, Agent, or Firm*—Stephen A. Gratton (57) ABSTRACT

A system for testing semiconductor components contained on a substrate, such as a wafer, a panel, a leadframe or a module, includes an interconnect configured to electrically engage all of the components on the substrate at the same time. The interconnect includes a switching network configured to selectively apply test signals to selected components, to electrically isolate defective components and to transmit test signals from selected groups of components. The system also includes a test apparatus, such as a wafer prober or a carrier for handling the substrate. A method for testing includes the steps of providing the interconnect having the switching network, and controlling test signals to the components using the switching network to perform various test procedures, such as functionality tests, parametric tests and burn-in tests.

45 Claims, 8 Drawing Sheets

U.S. PATENT DOCUMENTS

| | | |
|---|---|---|
| 5,055,780 A | 10/1991 | Takagi et al. |
| 5,070,297 A | 12/1991 | Kwon et al. |
| 5,103,557 A | 4/1992 | Leedy |
| 5,124,639 A | 6/1992 | Carlin et al. |
| 5,172,050 A | 12/1992 | Swapp |
| 5,177,439 A | 1/1993 | Liu et al. |
| 5,180,977 A | 1/1993 | Huff |
| 5,196,726 A | 3/1993 | Nishiguichi et al. |
| 5,225,037 A | 7/1993 | Elder et al. |
| 5,264,787 A | 11/1993 | Woith et al. |
| 5,323,107 A | 6/1994 | D'Souza |
| 5,329,423 A | 7/1994 | Scholz |
| 5,475,317 A | 12/1995 | Smith |
| 5,477,169 A | 12/1995 | Love |
| 5,483,741 A | 1/1996 | Akram et al. |
| 5,491,427 A | 2/1996 | Ueno et al. |
| 5,500,605 A | 3/1996 | Chang |
| 5,592,736 A | 1/1997 | Akram et al. |
| 5,625,298 A | 4/1997 | Hirano et al. |
| 5,686,317 A | 11/1997 | Akram et al. |
| 5,736,850 A | 4/1998 | Legal |
| 5,789,271 A | 8/1998 | Akram |
| 5,834,945 A | 11/1998 | Akram et al. |
| 5,869,974 A | 2/1999 | Akram et al. |
| 5,915,977 A | 6/1999 | Hembree et al. |
| 5,918,107 A | 6/1999 | Fogal |
| 5,962,921 A | 10/1999 | Farnworth et al. |
| 6,016,060 A | 1/2000 | Akram et al. |
| 6,040,702 A | 3/2000 | Hembree et al. |
| 6,060,891 A | 5/2000 | Hembree et al. |
| 6,064,216 A | 5/2000 | Farnworth |
| 6,072,321 A | 6/2000 | Akram et al. |
| 6,078,186 A | 6/2000 | Hembree et al. |
| 6,091,252 A | 7/2000 | Akram et al. |
| 6,107,109 A | 8/2000 | Akram et al. |
| 6,114,240 A | 9/2000 | Akram et al. |
| 6,127,736 A | 10/2000 | Akram |
| 6,181,144 B1 | 1/2001 | Hembree et al. |
| 6,188,232 B1 | 2/2001 | Akram et al. |
| 6,204,678 B1 | 3/2001 | Akram et al. |
| 6,208,157 B1 | 3/2001 | Akram et al. |
| 6,218,848 B1 | 4/2001 | Hembree et al. |
| 6,229,324 B1 | 5/2001 | Akram et al. |
| 6,232,243 B1 | 5/2001 | Farnworth et al. |
| 6,239,590 B1 | 5/2001 | Krivy et al. |
| 6,242,935 B1 | 6/2001 | Akram |
| 6,246,245 B1 | 6/2001 | Akram et al. |
| 6,246,250 B1 * | 6/2001 | Doherty et al. ............. 324/765 |
| 6,261,854 B1 | 7/2001 | Akram et al. |
| 6,275,052 B1 | 8/2001 | Hembree et al. |
| 6,281,044 B1 | 8/2001 | VanNortwick |
| 6,285,203 B1 | 9/2001 | Akram et al. |
| 6,294,837 B1 | 9/2001 | Akram et al. |
| 6,300,786 B1 | 10/2001 | Doherty et al. |
| 6,337,577 B1 * | 1/2002 | Doherty et al. ............. 324/765 |
| 6,366,112 B1 | 4/2002 | Doherty et al. |
| 6,433,574 B1 * | 8/2002 | Doherty et al. ............. 324/765 |
| 6,466,047 B1 | 10/2002 | Doherty et al. |
| 6,677,776 B2 * | 1/2004 | Doherty ...................... 324/765 |

\* cited by examiner

METHOD AND SYSTEM HAVING SWITCHING NETWORK FOR TESTING SEMICONDUCTOR COMPONENTS ON A SUBSTRATE

CROSS REFERENCE TO RELATED APPLICATIONS

This application is a continuation of Ser. No. 10/223,826, filed Aug. 20, 2002, now U.S. Pat. No. 6,677,776, which is a CIP of Ser. No. 09/675,072, filed Sep. 28, 2000, now U.S. Pat. No. 6,433,574, which is a division of Ser. No. 09/244,373, filed Feb. 04, 1999, now U.S. Pat. No. 6,337,577, which is a CIP of Ser. No. 09/075,691, filed May 11, 1998, now U.S. Pat. No. 6,246,250.

FIELD OF THE INVENTION

This invention relates generally to semiconductor manufacture, and specifically to a method and system for testing semiconductor components.

BACKGROUND OF THE INVENTION

Semiconductor components are typically fabricated on a common substrate which is then singulated into individual components. Semiconductor dice, for example, are fabricated on a semiconductor wafer. Semiconductor packages can be fabricated on a wafer, on a leadframe or on a panel. Some types of semiconductor components, such as multi chip modules and memory modules, also include multiple components contained on a common substrate.

Following the fabrication process, the components are tested. For testing the components, temporary electrical connections are made with terminal contacts on the components, and test signals are transmitted to the integrated circuits on the components. The testing procedures can be performed using a test system in which an interconnect of the system, such as a probe card, makes the temporary electrical connections with the terminal contacts on the components. A typical test system for semiconductor wafers includes a wafer prober for handling and positioning the wafers, a tester for generating and analyzing test signals, a probe card for making temporary electrical connections with the wafer, and a prober interface board for routing test signals from the tester pin electronics to the probe card.

With prior art testing processes, the components are typically tested one component at a time. With wafer testing for example, either the wafer or the probe card is stepped, such that only one die at a time is electrically engaged and tested. The stepping process takes additional time and introduces an additional variable in making the temporary electrical connections with the dice. Other prior art testing processes test the components after singulation from the substrate. Semiconductor packages and BGA devices, for example, are typically tested in singulated form.

The present invention is directed to a method and system for testing multiple components contained on a common substrate at the same time. The method and system can be used for testing components contained on a variety of substrates including wafers, panels, leadframes and modules.

SUMMARY OF THE INVENTION

In accordance with the present invention, a method and a system for testing semiconductor components contained on a substrate are provided. The method uses a switching network for multiplying and controlling the transmission of test signals from a tester to the components on the substrate. The switching network also electrically isolates defective components, and selectively transmits read test signals from selected groups of components on the substrate for expanding tester resources. The switching network can be used to control test signals for performing functionality tests, parametric tests and burn-in tests on the components.

The system includes the substrate containing the components, a test apparatus for handling the substrate, and the tester for applying the test signals to the components. The test apparatus includes the interconnect which includes interconnect contacts for making temporary electrical connections with the component contacts, and the switching network for controlling test signals to and from the interconnect contacts during testing of the components.

DETAILED DESCRIPTION OF THE PREFERRED EMBODIMENTS

As used herein, the term "semiconductor component" refers to an electronic element that includes a semiconductor die. Exemplary semiconductor components include semiconductor dice, semiconductor packages, semiconductor wafers, BGA devices, multi chip modules and circuit boards.

The term "substrate" refers to a base element on which multiple components are mounted or contained. Exemplary substrates include wafers or portions thereof, leadframes, panels, module substrates and boards.

Referring to FIGS. 1A–1C, 2A–2B, 3, 4A and 4B, various prior art substrates containing semiconductor components are illustrated. As will be further explained, the method and system of the invention can be used to test each of the substrates and the components thereon, as well as other types of substrates, which contain semiconductor components.

Figure 1A:
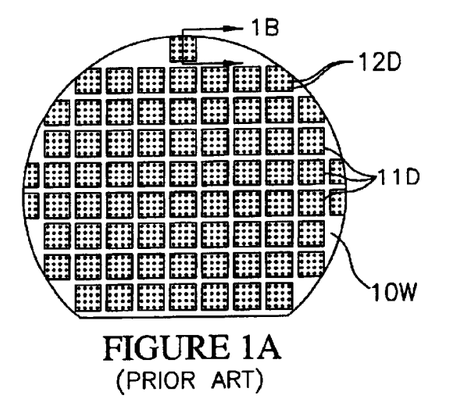
FIG. 1A is a schematic plan view of a prior art wafer substrate containing semiconductor components in the form of dice.
Figure 1B:
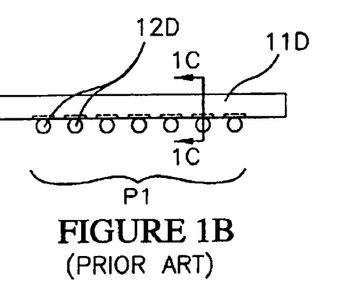
FIG. 1B is an enlarged cross sectional view taken along section line 1B—1B of FIG. 1A illustrating a component on the wafer substrate.

In FIG. 1A, a wafer substrate 10W, such as a semiconductor wafer, includes a plurality of components 11D such as semiconductor dice. The wafer substrate 10W comprises a semiconducting material such as silicon or gallium arsenide. FIG. 1B illustrates a component 11D that has been separated from the wafer substrate 10W. The component 11D includes an array of component contacts 12D, such as metal balls or bumps, formed on a face thereof. The component contacts 12D are formed in a selected pattern P1, such as a dense ball grid array (BGA).

Figure 1C:
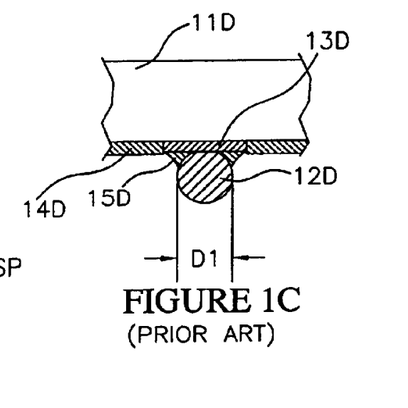
FIG. 1C is an enlarged cross sectional view taken along section line 1C—1C of FIG. 1B illustrating a bumped contact.

As shown in FIG. 1C, the component contacts 12D are bonded to bond pads 13D on the component 11D. The bond pads 13D are in electrical communication with the integrated circuits contained on the component 11D. In addition, the bond pads 13D are surrounded by a passivation layer 14D formed on the face of the component 11D. As also shown in FIG. 1C, fillets 15D attach the component contacts 12D to the bond pads 13D.

Figure 2A:
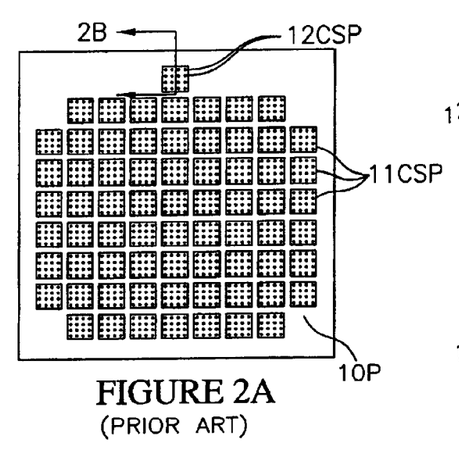
FIG. 2A is a schematic plan view of a prior art panel substrate containing semiconductor components in the form of chip scale packages.

Referring to FIG. 2A, a panel substrate 10P includes a plurality of semiconductor components 11CSP, such as chip scale packages. The panel substrate 10P comprises an electrically insulating material such as ceramic, a reinforced polymer laminate, such as bismaleimide triazine (BT), or an epoxy resin (e.g., FR-4).

Figure 2B:
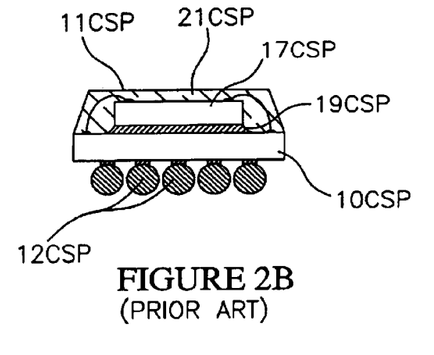
FIG. 2B is an enlarged cross sectional view taken along section line 2B—2B of FIG. 2A illustrating a component on the panel substrate.

As shown in FIG. 2B, each component 11CSP includes a component substrate 10CSP. The component substrate 10CSP comprises a segment of the panel substrate 10P which has been cut, sheared, punched or otherwise separated from a remainder of the panel substrate 10P. In addition, each component 11CSP includes a semiconductor die 17CSP wire bonded to the component substrate 10CSP, an adhesive layer 19CSP which attaches the die 17CSP to the component substrate 10CSP, and an encapsulating resin 21CSP encapsulating the die 17CSP. Each component 11CSP also includes an array of component contacts 12CSP in electrical communication with the integrated circuits contained on the die 17CSP.

The component contacts 12CSP are formed on the component substrate 10CSP in a dense grid array, such as a ball grid array (BGA), or a fine ball grid array (FBGA). By way of example, a representative diameter D1 for the component contacts 12CSP can be about 0.005-in (0.127 mm) to 0.050-in (1.270 mm) or greater. A representative pitch P (center to center spacing) of the component contacts 12CSP can be from about 0.008-in (0.228 mm) to about 0.060-in (1.524 mm) or greater.

Figure 3A:
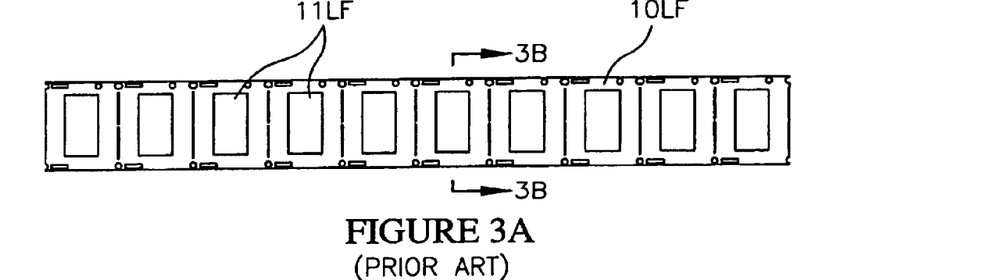
FIG. 3A is a schematic, plan view of a prior art leadframe substrate containing semiconductor components in the form of packages.
Figure 3B:
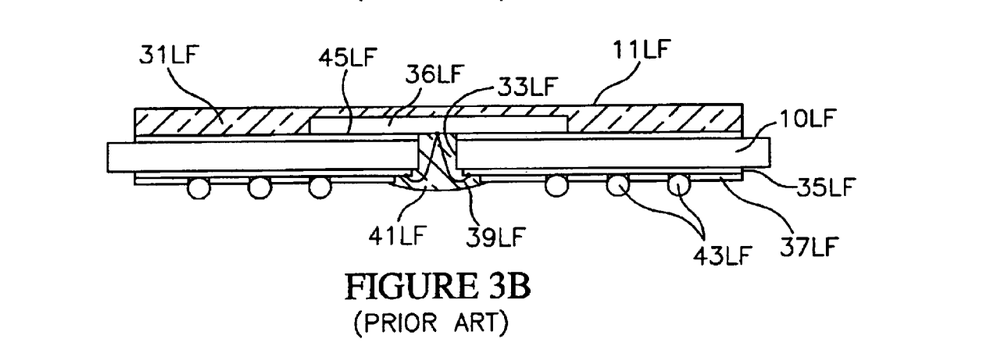
FIG. 3B is an enlarged cross sectional view taken along section line 3B—3B of FIG. 3A illustrating a component on the leadframe substrate.

Referring to FIGS. 3A and 3B, a leadframe substrate 10LF such as a leadframe, includes a plurality of semiconductor components 11LF, such as BGA devices. In the illustrative embodiment, the leadframe substrate 10LF comprises a polymer material, such as a reinforced polymer laminate (e.g., bismaleimide triazine (BT) polyimide). Alternately, a leadframe substrate can comprise a metal, such as a nickel-iron alloy, a copper alloy, or a clad stainless steel.

As shown in FIG. 3B, each component 11F includes a portion of the leadframe substrate 10LF. In addition, each component 11LF includes a semiconductor die 36LF, and an encapsulating resin 31LF which encapsulates the die 36LF. An adhesive layer 45LF bonds the die 36LF to the leadframe substrate 10LF in a board-on-chip configuration. In addition, wires 39LF are wire bonded through an opening 33LF in the leadframe substrate 10LF, to the die 36LF and to conductors 35LF on the leadframe substrate 10LF. Further, a glob top encapsulant 41LF encapsulates the wires 39LF and associated wire bonds. The components 11LF also include solder masks 37LF on the conductors 35LF, and solder balls 43LF in electrical communication with the conductors 35LF. The solder balls 43LF are arranged in a dense grid array, such as a ball grid array or fine ball grid array.

Figure 4A:
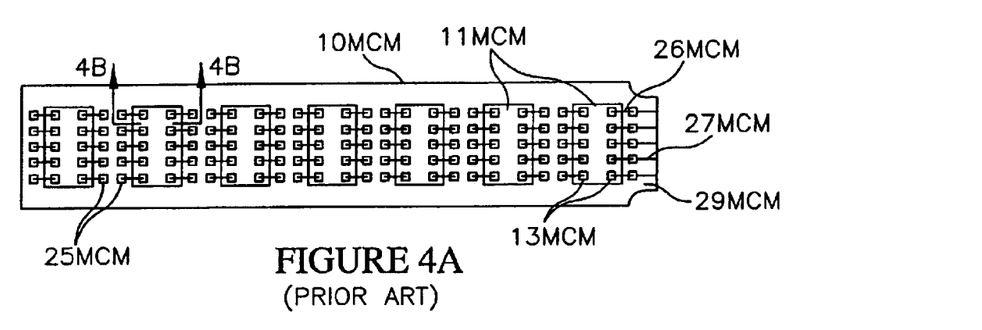
FIG. 4A is a schematic plan view of a prior art module substrate containing semiconductor components in the form of dice or packages.
Figure 4B:
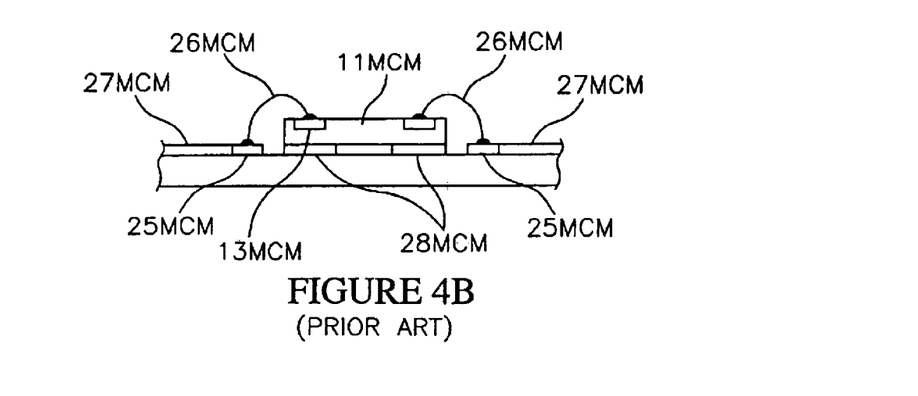
FIG. 4B is an enlarged cross sectional view taken along section line 4B—4B of FIG. 4A illustrating a component on the module substrate.

Referring to FIGS. 4A and 4B, a module substrate 10MCM, such as a multi chip module, includes a plurality of semiconductor components 11MCM in the form of semiconductor dice, or alternately semiconductor packages. The module substrate 10MCM comprises an electrically insulating material, such as ceramic, or plastic. Adhesive members 28MCM attach the components 11MCM to the module substrate 10MCM. In addition, the module substrate 10MCM includes electrodes. 25MCM which are electrically connected to bond pads 13MCM on the components 11MCM. Wires 26MCM are wire bonded to the electrodes 25MCM and to the bond pads 13MCM to form separate electrical paths therebetween. The module substrate 10MCM also includes conductive traces 27MCM, and an edge connector 29MCM in electrical communication with the electrodes 25MCM. The module substrate 10MCM, components 11MCM and conductive traces 27MCM can be configured as a memory module or other electronic element having a desired configuration.

Test System

Figure 5:
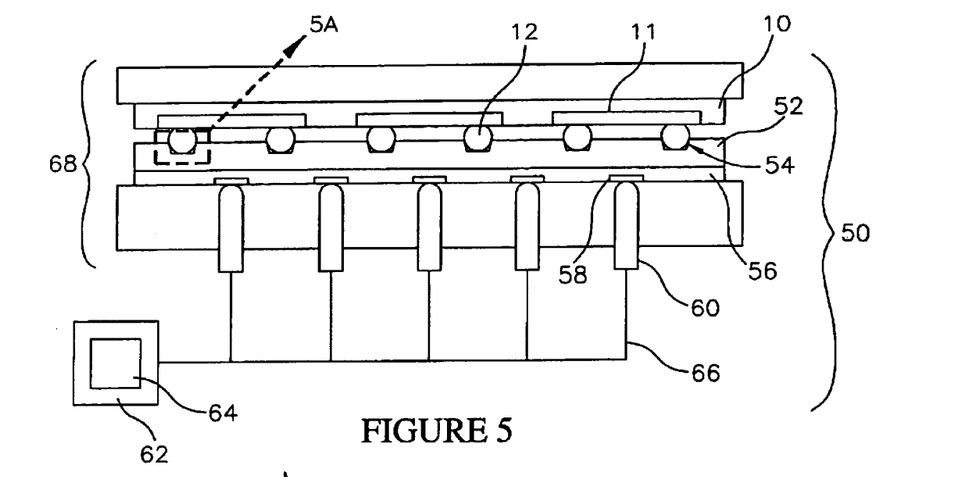
FIG. 5 is a schematic diagram of a generic test system constructed in accordance with the invention.

Referring to FIG. 5, a generic test system 50 constructed in accordance with the invention is illustrated. The test system 50 is adapted to test semiconductor components 11 contained on a substrate 10 and having component contacts 12. The substrate 10 and the components 11 can be in any one of the previously described configurations, such as the wafer substrate 10W and the components 11D of FIGS. 1A–1C, the panel substrate 10P and the components 11CSP of FIGS. 2A–2B, the leadframe substrate 10LF and the components 11LF of FIGS. 3A–3B, or the module substrate 10MCM and the components 11MCM of FIGS. 4A–4B.

The test system 50 includes an interconnect 52 which comprises a plurality of interconnect contacts 54. The interconnect contacts 54 are configured to make temporary electrical connections with all of the component contacts 12 on all of the components 11 contained on the substrate 10 at the same time. These temporary electrical connections can be used to apply test signals to the integrated circuits contained on the semiconductor components 11.

The test system 50 also includes a switching network 56 on the interconnect 52 in electrical communication with the interconnect contacts 54. The switching network 56 is configured to multiply (i.e., fan out), and to selectively transmit, "write" test signals to selected components 11, or to selected groups of components 11, on the substrate 10 in response to control signals. The switching network 56 is also configured to selectively transmit "read" test signals from selected groups of components 11 for expanding tester resources. In addition, the switching network 56 is configured to electrically isolate or disconnect defective components 11. As will be further explained, the switching network 56 includes integrated circuitry and active electrical switching devices, such as FETs, operable by control signals generated by a controller.

The test system 50 also includes a tester 62 and electrical connectors 60 in electrical communication with the tester 62. The tester 62 includes test circuitry 64 configured to generate and transmit "write" test signals through the switching network 56 to the components 11. In addition, the tester 62 is configured to analyze "read" test signals transmitted from the components 11 and through the switching network 56. The electrical characteristics of the test signals, and the configuration of the tester 62 will depend on the test procedures being performed. Exemplary test procedures include functionality tests, such as tests for opens and shorts, parametric tests such as speed grading, and burn-in tests wherein the components 11 are heated and test signals are applied. Depending on the components 11, suitable testers 62 are commercially available from Teradyne of Boston, Mass., as well as other manufacturers.

The tester 62 also includes a plurality of separate electrical paths 66 to the electrical connectors 60. The signal generating and analyzing capability of the tester 62, and the number of separate electrical paths 66 provided by the tester 62, are termed herein as "tester resources". In general, the configurations of the test circuitry 64, and of the electrical paths 66, are fixed for a particular tester 62 by the manufacturer. For example, the test circuitry 64 can be configured to route drive only signals through some of the electrical paths 66, and input/output channels through other of the electrical paths 66, as required for testing a particular type of component 11.

The test system 50 also includes a testing apparatus 68 configured to retain and align the substrate 10 with the interconnect 52. The testing apparatus 68 also functions to bias the substrate 10 and the interconnect 52 together with a force sufficient to establish the temporary electrical connections between the interconnect contacts 54 and the component contacts 12. The configuration of the testing apparatus 50 is dependent on the substrate 10, the components 11 being tested, and the test procedures being performed. For example, for testing the wafer substrate 10W (FIG. 1A) the testing apparatus 50 can comprise a wafer prober. For testing the panel substrate 10P (FIG. 2A) or the leadframe substrate 10LF, the testing apparatus can comprise a test carrier.

Figure 5A:
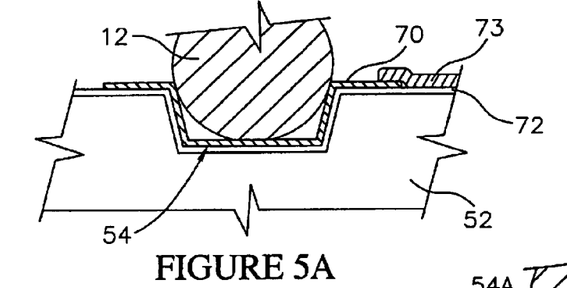
FIG. 5A is an enlarged cross sectional view taken along line 5A of FIG. 5 illustrating an interconnect contact.

Referring to FIG. 5A, a single interconnect contact 54 is illustrated. In the illustrative embodiment, the interconnect 52 comprises silicon and the interconnect contacts 54 comprise conductive pockets configured to retain and electrically engage the component contacts 12. In addition, the interconnect contacts 54 include conductive layers 70 on the pockets, and the interconnect 52 includes patterns of conductors 73 in electrical communication with the conductive layer 70. The conductors 73 establish electrical communication between the interconnect contacts 54 and the multiplex contacts 58, and with other electrical elements on the interconnect 52 as required. The conductive layers 70 and the conductors 73 can comprise a metal such as aluminum, titanium, nickel, iridium, copper, gold, tungsten, silver, platinum, palladium, tantalum, molybdenum or alloys of these metal. The interconnect 52 also includes an insulating layer 72 for electrically insulating the interconnect contacts 54, the conductive layers 70 and the conductors 73 from the bulk of the interconnect 52. The interconnect contacts 54 and conductors 73 can be fabricated as described in U.S. Pat. No. 6,107,109 to Akram et al., which is incorporated herein by reference.

Figure 5B:
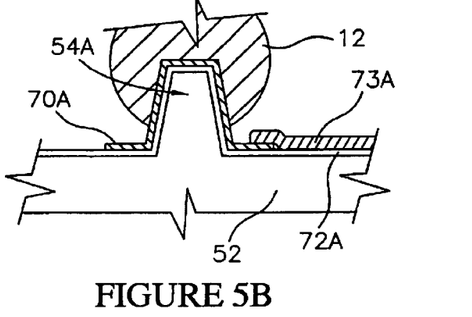
FIG. 5B is an enlarged cross sectional view equivalent to FIG. 5A of an alternate embodiment interconnect contact.

Referring to FIG. 5B, alternate embodiment interconnect contacts 54A are configured to penetrate the component contacts 12 to form the temporary electrical connections. In this embodiment the interconnect comprises silicon, and the interconnect contacts 54A comprise projections covered with conductive layers 70A in electrical communication with conductors 73A, and electrically insulated by an insulating layer 72A. The interconnect contacts 54A and the conductors 73A can be fabricated as described in U.S. Pat. No. 5,686,317 to Akram et al., and in U.S. Pat. No. 5,686,317 to Akram et al., both of which are incorporated herein by reference.

Figure 5C:
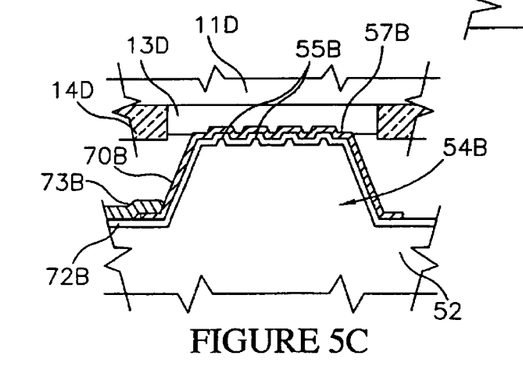
FIG. 5C is an enlarged cross sectional view equivalent to FIG. 5A of an alternate embodiment interconnect contact.

Referring to FIG. 5C, alternate embodiment interconnect contacts 54B are configured to electrically engage planar component contacts, such as bond pads 13D on the component 11D. In this embodiment, the interconnect 52 comprises silicon, and the interconnect contacts 54B comprise raised members that project from a surface of the interconnect 52. In addition, the interconnect contacts 54B include penetrating projections 55B adapted to penetrate the bond pads 13D to a limited penetration depth. To limit the penetration depth, the penetrating projections 55B have a height that is less than a thickness of the bond pads 13D. In addition, surfaces 57B at the tips of the interconnect contacts 54B provide stop planes for limiting penetration into the bond pads 13D. In addition, each interconnect contact 54B is covered with a conductive layer 70B in electrical communication with a conductor 73B. Further, an insulating layer 72B electrically insulates the conductive layers 70B and the conductors 73B. A process for fabricating the interconnect contacts 54B on a silicon substrate, substantially as shown in FIG. 5C is described in previously cited U.S. Pat. No. 5,483,741, to Akram et al., and U.S. Pat. No. 5,686,317 to Akram et al.

Switching Network

Figure 6:
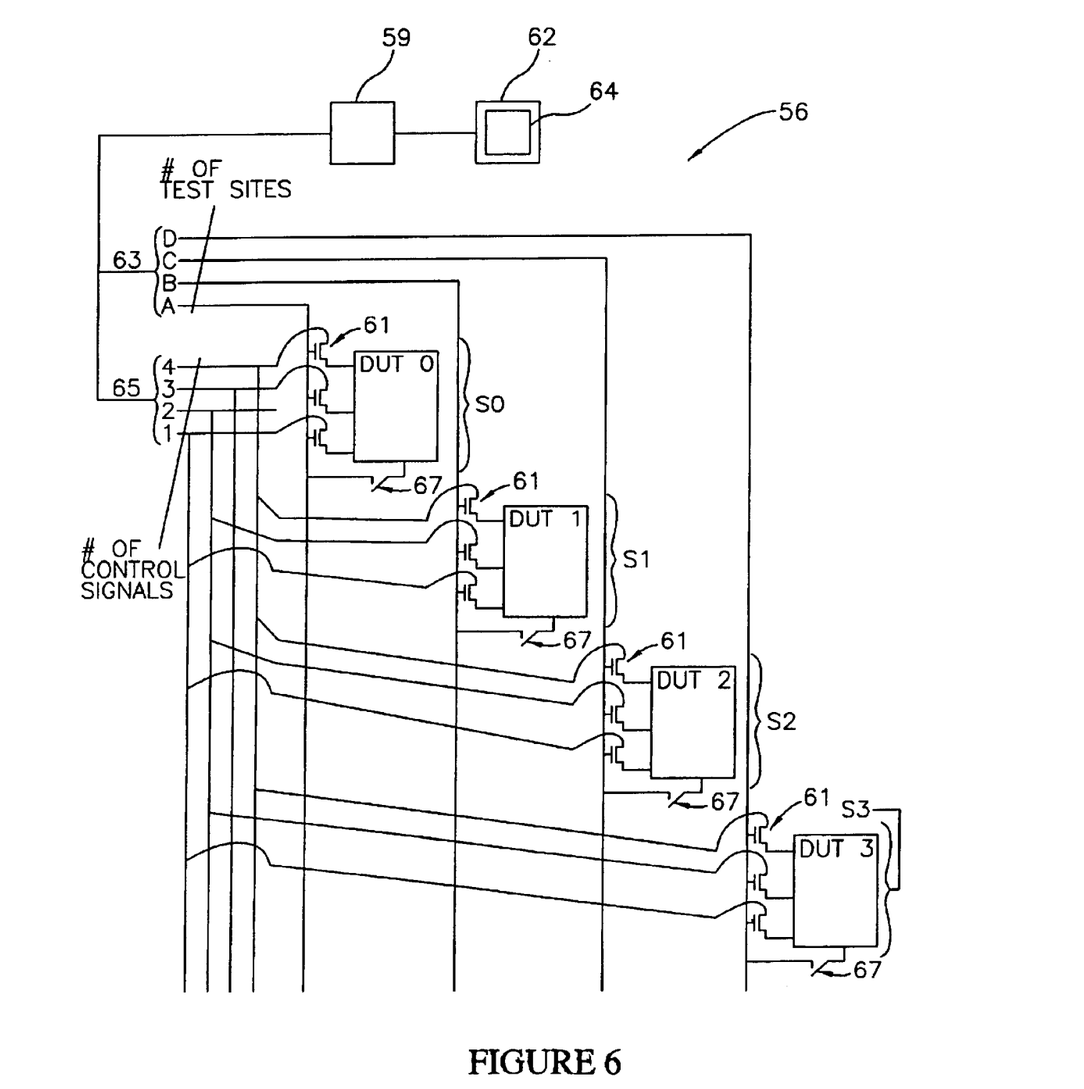
FIG. 6 is an electrical schematic diagram illustrating a switching network of the test system.

Referring to FIG. 6, the switching network 56 of the test system 50 is illustrated. The switching network 56, simply states, comprises a grid of active electrical switching devices 61, such as field effect transistors (FETs) configured to control the transmission of signals from the tester 62 (FIG. 5) to the components 11. The components 11 being tested are termed herein as devices under test (DUTs).

The switching network 56 includes a plurality of test sites S0, S1, S2, S3 etc., each of which is configured to test a DUT (e.g., DUT 0, DUT 1, DUT 3, DUT 4 etc). Each test site S0, S1, S2, S3 etc., includes a plurality of active electrical switching devices 61 in electrical communication with the interconnect contacts 54 (FIG. 5). For simplicity each test site S0, S1, S2, S3 etc. is illustrated with only three active electrical switching devices 61. Each test site S0, S1, S2, S3 etc., also includes at least one on-off switch 67.

The switching network 56 includes a master site control 63 in electrical communication with a controller 59. The master site control 63 includes a plurality of separate control lines A, B, C, D etc. Each test site S0, S1, S2, S3 etc. has an associated control line A, B, C, D etc. in electrical communication with the gate elements of the active electrical switching devices 61 for the test site. The master site control 63 is operable by the controller 59 to electrically connect or isolate the test sites S0, S1, S2, S3 etc. by selective operation of the gate elements of the active electrical switching devices 61. In particular, the master site control 63 is operable by the controller 59 to place the active electrical switching devices 61 in either an "on" condition or an "off" condition.

The switching network 56 also includes a signal control 65 having control lines 1, 2, 3, 4 etc. in electrical communication with the sources or drains of the active electrical switching devices 61. The signal control 65 can be used to write all of the DUTs at the same time, and to place all of the DUTs in a selected mode at the same time. For example, if the DUTs comprise DRAMs the signal control 65 can be used to place all of the DUTs in a refresh mode. The signal control 65 can also be used to selectively read signals from the DUTs individually, or in groups. The signal control 65 can also be used to selectively transmit "write" test signals from the tester 62 to selected DUTs, or groups of DUTs, and to selectively transmit "read" test signals from selected DUTs or groups of DUTs.

Test Method

Figure 7:
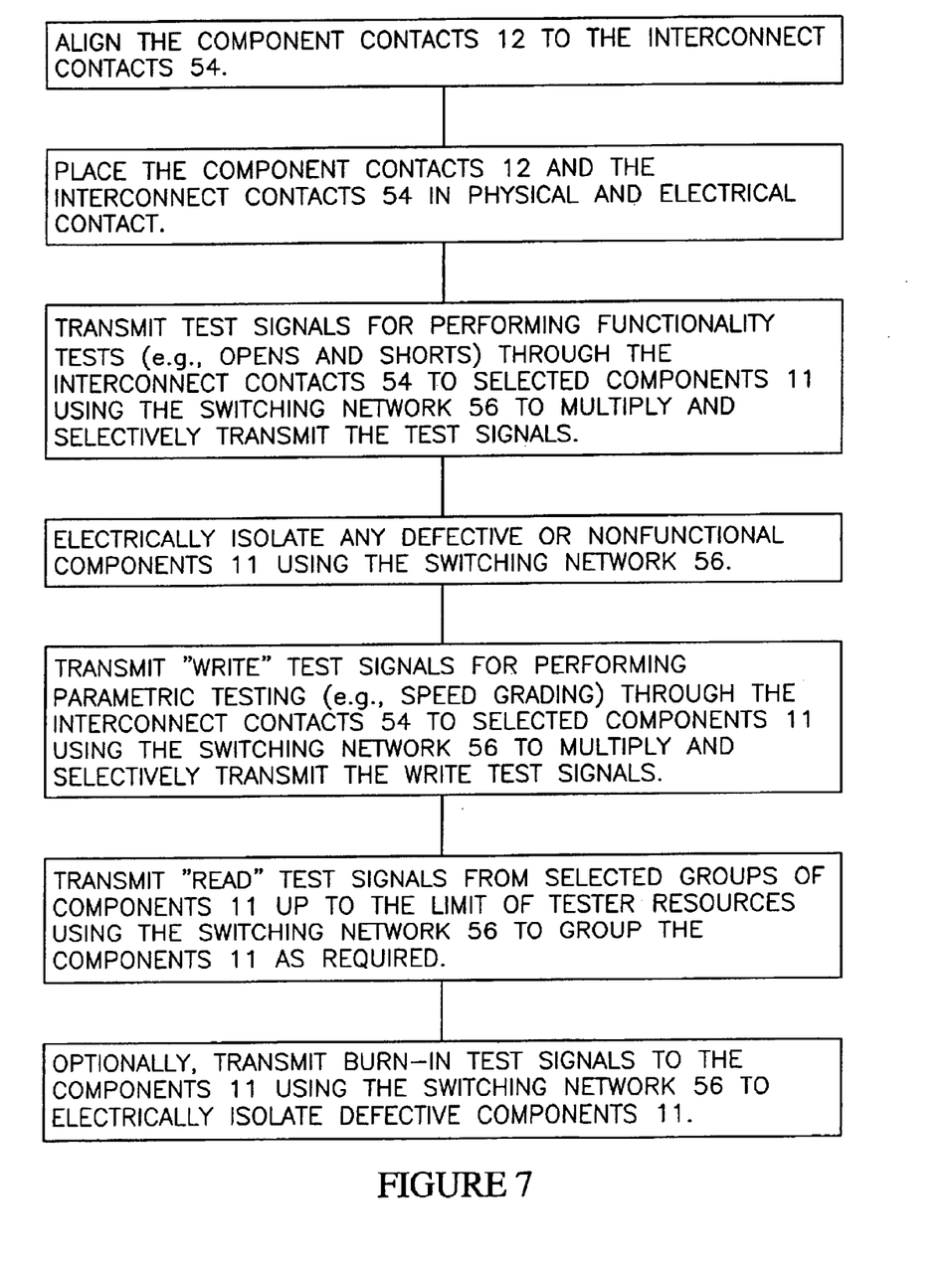
FIG. 7 is a block diagram illustrating steps in the method of the invention.

Referring to FIG. 7, steps in a method for testing the components 11 on the substrate 10 using the test system 50 of FIG. 5 are illustrated.

1. Align the component contacts 12 to the interconnect contacts 54.
2. Place the component contacts 12 and the interconnect contacts 54 in physical and electrical contact.
3. Transmit test signals for performing functionality tests (e.g., opens and shorts) through the interconnect contacts 54 to selected components 11 using the switching network 56 to multiply and selectively transmit the test signals.
4. Electrically isolate any defective or non-functional components 11 using the switching network 56.
5. Transmit "write" test signals for performing parametic testing (e.g., speed grading) through the interconnect contacts 54 to selected components 11 using the switching network 56 to multiply and selectively transmit the write test signals.
6. Transmit "read" test signals from selected groups of components 11 up to the limit of tester resources using the switching network 56 to group the components 11 as required.
7. Optionally, transmit burn-in test signals to the components 11 using the switching network 56 to electrically isolate defective components 11.

Wafer Test System

Figure 8:
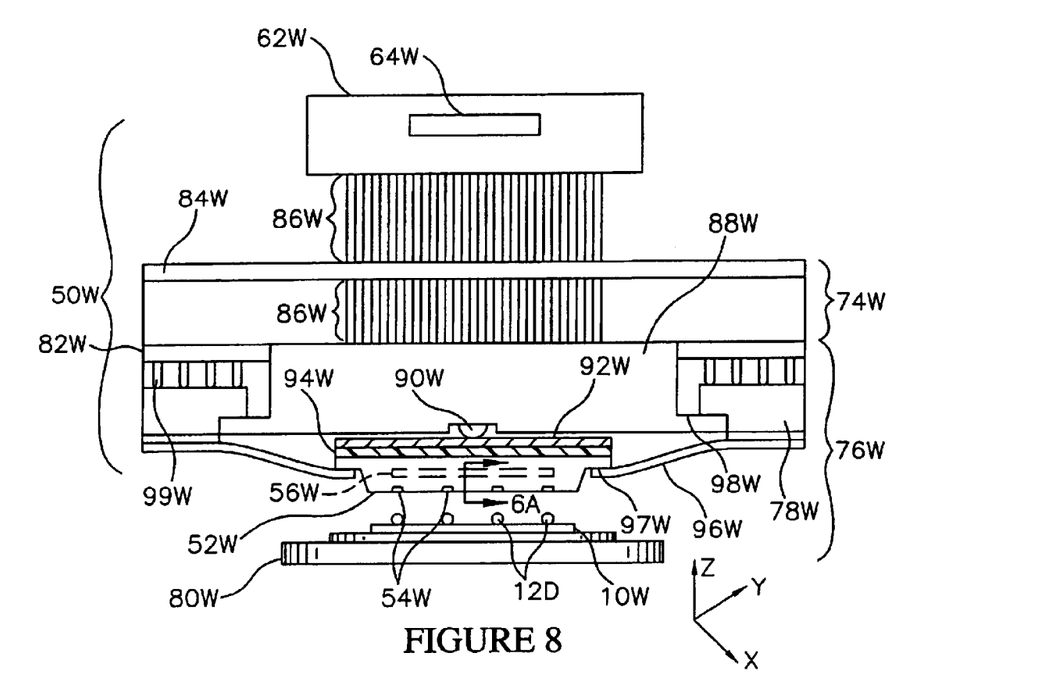
FIG. 8 is a schematic diagram of a wafer test system constructed in accordance with the invention.

Referring to FIG. 8, a wafer test system 50W constructed in accordance with the invention, and configured to test components 11D (FIG. 1A) contained on the wafer substrate 10W is illustrated. The wafer test system 50W includes a test head 74W and an interconnect 52W. The interconnect 52W includes patterns of interconnect contacts 54W configured to make temporary electrical connections with the component contacts 12D. The interconnect 52W also includes a switching network 56W in electrical communication with the interconnect contacts 54W.

The wafer test system 50W also includes a wafer prober 76W wherein the interconnect 52W is mounted, and a tester 62W having test circuitry 64W configured to apply test signals through the interconnect 52W, to the components 11D contained on the wafer substrate 10W, and to analyze the resultant signals. The wafer prober 76W includes an interconnect holder 78W for mounting and electrically interfacing with the interconnect 52W.

The wafer prober 76W also includes a wafer chuck 80W configured to move in X and Y directions to align the wafer substrate 10W with the interconnect 52W, and in the Z direction to move the wafer substrate 10W into contact with the interconnect 52W. One suitable wafer prober 76W is manufactured by Electroglass and is designated a Model 4080.

The test system 50W also includes a prober interface board 82W for routing test signals from the test head 74W to the interconnect 52W. In addition, the prober interface board 82W can be in electrical communication with tester pin electronics 84W in the test head 74W. The tester pin electronics 84W provide separate electrical paths 86W from the test circuitry 64W contained in the tester 62W, to the test head 74W and to the prober interface board 82W.

Still referring to FIG. 8, the wafer prober 76W also includes a force applying fixture 88W and a force applying mechanism 90W. These items can be components of a conventional wafer prober as previously described. The force applying mechanism 90W presses against a pressure plate 92W and a compressible member 94W to bias the interconnect 52W against the wafer substrate 10W. By way of example, the compressible member 94W can be formed of an elastomeric material such as silicone, butyl rubber, or fluorosilicone; in foam, gel, solid or molded configurations.

In addition, a flexible membrane 96W is bonded to the interconnect 52W and to the interconnect holder 78W. In general, the flexible membrane 96W functions to physically attach the interconnect 52W to the interconnect holder 78W. In addition, the flexible membrane 96W functions to provide electrical paths between the switching network 56W, the interconnect contacts 54W and the test circuitry 64W of the tester 62W. The flexible membrane 96W can be formed of thin flexible materials to allow movement of the interconnect 52W in Z-directions. For example, the flexible membrane 96W can be formed of a flexible multi layered material similar to TAB tape.

In the illustrative embodiment, the flexible membrane 96W comprises a layer of polymer tape having metal conductors thereon. Bonded connections are formed between the conductors on the membrane 96W and corresponding conductors 98W on the interconnect holder 78W. In addition, bonded connections are formed between the conductors on the membrane 96W and bonding pads 97W on the interconnect 52W.

Still referring to FIG. 8, the wafer prober 76W includes spring loaded electrical connectors 99W which are in electrical communication with the prober interface board 82W. One type of spring loaded electrical connector 99W is manufactured by Pogo Industries of Kansas City, Mo. under the trademark "POGO PINS". The electrical connectors 99W electrically communicate with the conductors 98W on the interconnect holder 78W.

The interconnect mounting arrangement shown in FIG. 8, as well as others, are described in U.S. Pat. No. 6,060,891, to Hembree et al., which is incorporated herein by reference. However, it is to be understood that these mounting arrangements are merely exemplary, and the interconnect 52W can be mounted in any conventional manner.

In the embodiment illustrated in FIG. 8, the interconnect 52W comprises a semiconductor material, such as silicon, and the switching network 56W is formed in the semiconductor material using semiconductor fabrication techniques.

As such, the interconnect 52W includes active electrical switching devices, such as FET transistors, formed integrally with the semiconductor material.

Figure 8A:
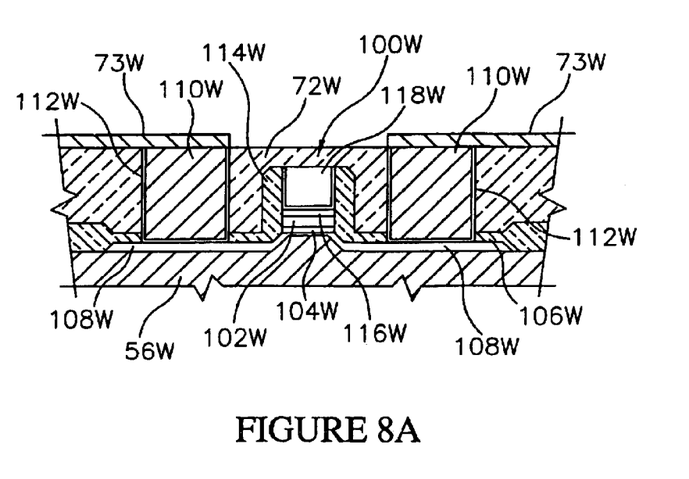
FIG. 8A is an enlarged cross sectional view taken along line 8A of FIG. 8 illustrating an FET transistor of the switching network on an interconnect of the wafer test system.

For example, the switching network 56W can include FET transistor constructed substantially as shown in FIG. 8A for transistor 100W. However, as is apparent the FET transistor 100W is merely one component of the switching network 56W, and the switching network 56W can include additional components to function in the previously described manner. Further, other active electrical switching devices, such as NPN or PNP transistors can be used in place of the FET transistor 100W illustrated in FIG. 6A.

The FET transistor 100W includes a polysilicon gate 102W, and a gate oxide 104W. In addition, an isolation structure 106W, such as a field oxide or an isolation trench is formed on the interconnect 56W for electrically isolating the FET transistor 100W from adjacent transistors. The FET transistor 100W also includes N+active areas 108W, which can be formed by implanting dopants into the interconnect 56W to form the source and drain of the FET transistor 100W. Metal filled vias 110W with metal silicide layers 112W, electrically connect the source and drain of the FET transistor 100W to conductors 73W in electrical communication with the interconnect contacts 54W (FIG. 8) and the bonding pads 97W (FIG. 8). In addition, an insulating layer 72W electrically insulates the conductors 73W, the interconnect contacts 54W and the bonding pads 97W. The FET transistor 100W also includes spacers 114W, TEOS layers 116W and nitride caps 118W.

Panel Test System

Figure 9A:
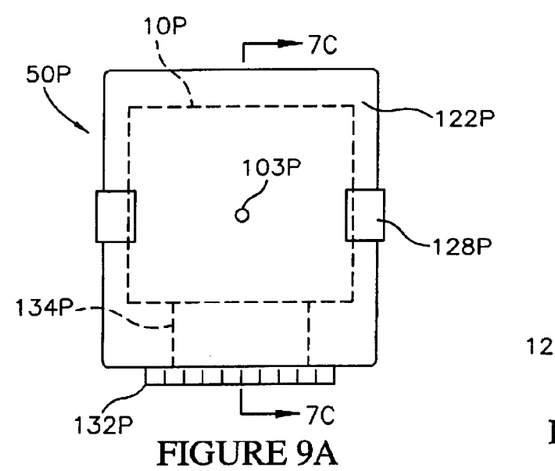
FIG. 9A is a schematic plan view of a panel test system constructed in accordance with the invention.
Figure 9B:
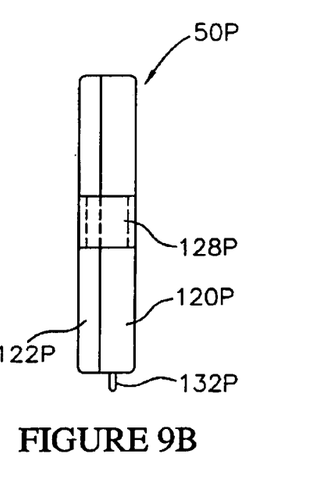
FIG. 9B is a side elevation view of FIG. 9A.
Figure 9C:
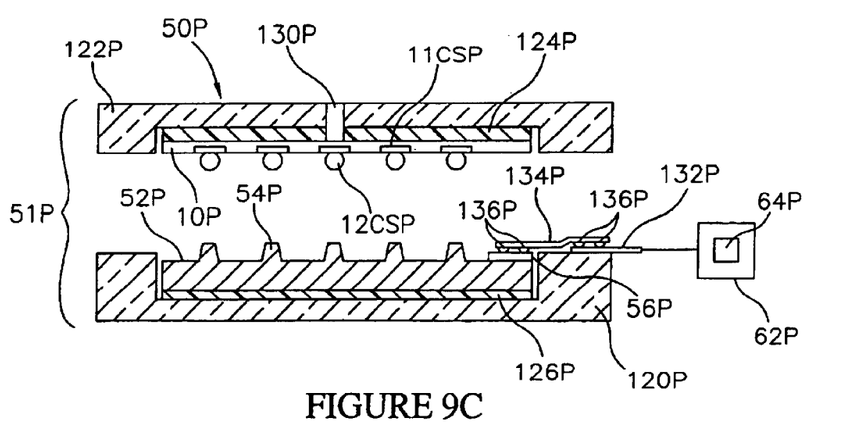
FIG. 9C is an enlarged schematic cross sectional view taken along section line 9C of FIG. 9A.

Referring to FIGS. 9A–9C, a panel test system 50P constructed in accordance with the invention is illustrated. The panel test system 50P can be used to perform functionality, parametic and burn-in testing of the previously described components 11CSP contained on the panel substrate 10P. These tests can be performed sequentially or separately using the panel test system 50P. The panel test system 50P can also be used to test the components 11MCM contained on the multi chip module substrate 10MCM.

The panel test system 50P includes a carrier 51P for holding and applying the required test signals to the components 11CSP. These test signals can include functionality test signals, parametric test signals and burn-in test signals. For performing burn-in testing the carrier 51P can be placed in a burn-in oven configured to heat the components 11CSP to a required temperature for a required time period.

The carrier 51P includes a base 120P; a cover 122P; an interconnect 52P (FIG. 9C); and a force applying member in the form of elastomeric spring members 124P and 126P (FIG. 9C). The base 120P and the cover 122P comprise an insulating material such as molded plastic or laminated ceramic, and are adapted for mating physical engagement. In addition, the base 120P and the cover 122P have a size that corresponds to the size of the panel substrate 10P. Clip members 128P removably secure the cover 122P to the base 120P with the panel substrate 10P therein. In addition, one or more vacuum openings 130P are formed in the cover 122P and in the spring member 124P, for securing the panel substrate 10P to the cover 122P during alignment and assembly of the panel test system 50P.

As shown in FIG. 9C, the base 120P can include a cavity for mounting the interconnect 52P and elastomeric spring member 126P. In a similar manner, the cover 124P can include a cavity for mounting the panel substrate 10P and the elastomeric spring member 124P. The elastomeric spring members 124P, 126P can comprise a material such as silicone, butyl rubber, or fluorosilicone.

The base 120P also includes an electrical connector 132P in the form of a male or female connector adapted for mating electrical engagement with a corresponding connector formed on a testing apparatus. In addition, an electrical path can be formed between the interconnect 52P and the electrical connector 132P by a length of TAB (tape automated bonding) tape 134P. One type of TAB tape comprises a layer of polyimide having a desired pattern of metal conductors formed thereon. The conductors can include metal bumps 136P formed in vias through the polyimide and arranged in a desired pattern. The metal bumps 136P on the TAB tape 134P can be bonded, using heat or ultrasound, to corresponding connection points on the interconnect 52P and on the electrical connector 132P to form an electrical connection therebetween. Alternately this electrical connection can be formed by wire bonding or mechanical electrical connectors.

As shown schematically in FIG. 9C, the interconnect 52P includes interconnect contacts 54P and a switching network 56P in electrical communication with the interconnect contacts 54P. The interconnect contacts 54P are constructed as previously described for interconnect contacts 54A (FIG. 5B) and are adapted to form temporary electrical connections with the component contacts 12CSP on the components 11CSP.

The panel test system 50P also includes a tester 62P having test circuitry 64P. In this case, the tester 62P can comprise a test board having a socket configured to electrically engage the electrical connector 132P. Assembly and alignment of the panel substrate 10P in the panel test system 50P can be performed as described in U.S. Pat. No. 6,064,216, to Farnworth et al., which is incorporated herein by reference.

Leadframe Test System

Figure 10A:
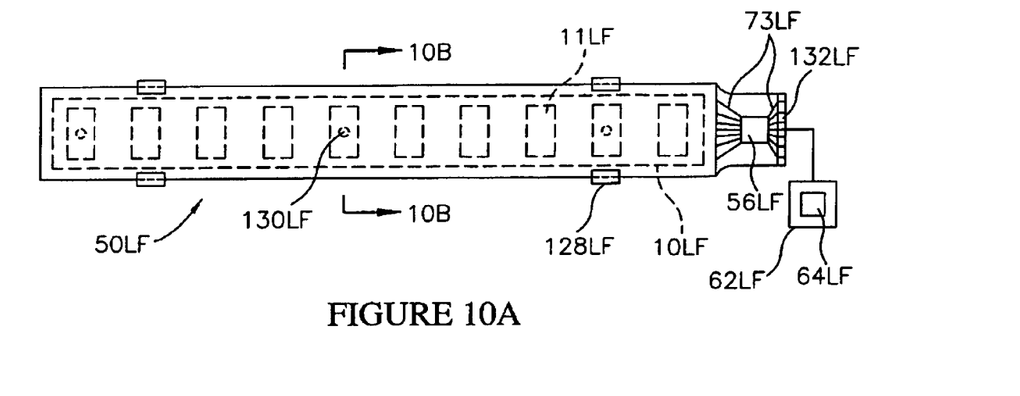
FIG. 10A is a schematic plan view of a leadframe test system constructed in accordance with the invention.
Figure 10B:
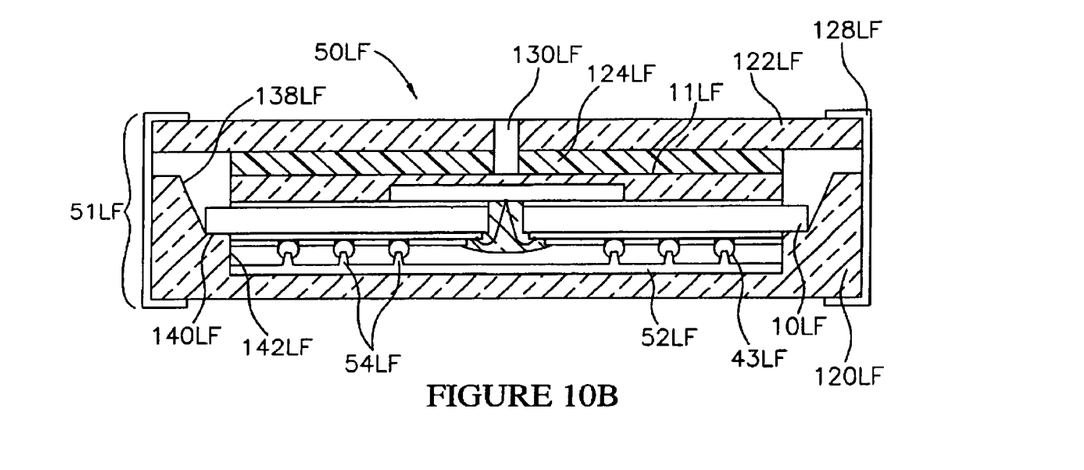
FIG. 10B is an enlarged schematic cross sectional view taken along section line 10B of FIG. 10A.

Referring to FIGS. 10A–10B, a leadframe test system 50LF constructed in accordance with the invention is illustrated. The leadframe test system 50LF can be used to perform functionality, parametic and burn-in testing of the previously described components 11LF contained on the leadframe substrate 10LF. These tests can be performed sequentially or separately.

The leadframe test system 50LF includes a carrier 51LF configured to hold the leadframe substrate 10LF for testing and to apply the required test signals to the components 11LF. These test signals can include functionality test signals, parametric test signals and burn-in test signals. For performing burn-in testing the carrier 51LF can be placed in a burn-in oven for heating the components 11LF to a required temperature for a required time period.

The carrier 51LF includes a base 120LF; a cover 122LF; an interconnect 52LF; and a force applying member in the form of elastomeric spring members 124LF. The base 120LF and the cover 122LF comprise an insulating material such as molded plastic or laminated ceramic, and are adapted for mating physical engagement. In addition, the base 120LF and the cover 122LF have a size that corresponds to the size of the leadframe substrate 10LF. Clip members 128LF removably secure the cover 122LF to the base 120LF with the leadframe substrate 10LF therein. In addition, one or more vacuum openings 130LF are formed in the cover 122LF and in the spring member 124LF, for securing the leadframe substrate 10LF to the cover 122LF during alignment and assembly of the leadframe test system 50LF.

The base 120LF includes an alignment member in the form of an alignment opening 138LF having sloped sidewalls configured to engage the opposed longitudinal edges of the leadframe substrate 10LF and to align the leadframe substrate 10LF on the interconnect 52LF. The base 120LF also includes a recessed surface 140LF configured to support the leadframe substrate 10LF, and a cavity 142LF wherein the interconnect 52LF is mounted.

As shown schematically in FIG. 10B, the interconnect 52LF includes a pattern of interconnect contacts 54LF. The size and shape of the alignment opening 138LF, the recessed surface 140LF, and the cavity 142LF are such that the solder balls 43LF on the leadframe substrate 10LF align with the interconnect contacts 54LF on the interconnect 52LF. The interconnect contacts 54LF are constructed as previously described for interconnect contacts 54A (FIG. 5B) and are adapted to form temporary electrical connections with the component contacts 43LF on the components 11LF.

The interconnect 52LF also includes a switching network 56LF (FIG. 10A) in electrical communication with the interconnect contacts 54LF. In this case the switching network 56LF is contained on a separate die attached to the interconnect 52LF. Conductors 73LF on the interconnect 52LF electrically connect the interconnect contacts 54LF to the switching network 56LF. In addition an electrical connector 132LF such as a male or female edge connector is mounted to the interconnect 52LF in electrical communication with the switching network 56LF and the conductors 73LF.

The leadframe test system 50LF also includes a tester 62LF having test circuitry 64LF. In this case, the tester 62LF can comprise a test board having a socket configured to electrically engage the electrical connector 132LF.

Thus the invention provides an improved system and method for testing semiconductor components contained on a substrate. While the invention has been described with reference to certain preferred embodiments, as will be apparent to those skilled in the art, certain changes and modifications can be made without departing from the scope of the invention as defined by the following claims.

What is claimed is:

1. A system for testing semiconductor components on a substrate comprising:
    an interconnect comprising a plurality of interconnect contacts configured to electrically engage the components;
    a switching network in electrical communication with the interconnect contacts;
    a tester configured to transmit test signals through the switching network and the interconnect to the components;
    the switching network configured to multiply and selectively transmit the test signals, to electrically isolate non-functional components and to read test signals from selected groups of components.

2. The system of claim 1 further comprising a carrier containing the interconnect configured to hold the substrate.

3. The system of claim 2 wherein the carrier is configured for placement in a burn-in oven.

4. The system of claim 3 further comprising a wafer prober containing the interconnect configured to handle the substrate.

5. The system of claim 1 wherein the switching network comprises a die on the interconnect.

6. The system of claim 1 wherein the interconnect comprises a semiconductor material and the switching network comprises active electrical devices in the material.

7. The system of claim 1 wherein the components comprise dice and the substrate comprises a wafer.

8. The system of claim 1 wherein the components comprise packages and the substrate comprises a leadframe or a panel.

9. A system for testing semiconductor components on a substrate comprising:
    a testing apparatus comprising an interconnect configured to electrically engage the components on the substrate;
    a tester in electrical communication with the interconnect configured to generate and analyze test signals for testing the components; and
    a switching network on the testing apparatus in electrical communication with the interconnect configured to control test signals applied through the interconnect to the components.

10. The system of claim 9 wherein the testing apparatus comprises a wafer prober.

11. The system of claim 9 wherein the testing apparatus comprises a carrier configured to hold the substrate.

12. The system of claim 9 wherein the testing apparatus comprises a tester and the switching network is configured to expand resources of the tester by transmitting read test signals from selected groups of components.

13. The system of claim 9 wherein the switching network comprises a plurality of active electrical switching devices.

14. The system of claim 9 wherein the substrate comprises a wafer and the components comprise dice on the wafer.

15. The system of claim 9 wherein the substrate compress a leadframe and the components comprise packages on the leadframe.

16. The system of claim 9 wherein the substrate comprises a panel and the components comprise packages on the panel.

17. A system for testing semiconductor components on a substrate comprising:
    a carrier configured to hold the substrate;
    an interconnect on the carrier configured to electrically engage the components held by the carrier; and
    a switching network on the carrier configured to selectively control applying of test signals through the interconnect to the components.

18. The system of claim 17 wherein the substrate comprises a wafer, a panel, a leadframe or a module.

19. The system of claim 17 wherein the carrier comprises a base for mounting the interconnect, a cover for holding the substrate, and a force applying mechanism for biasing the substrate and the interconnect together.

20. The system of claim 17 wherein the carrier comprises an alignment member configured to align the substrate on the carrier.

21. The system of claim 17 wherein the substrate comprises a wafer and the components comprise semiconductor dice.

22. The system of claim 17 wherein the substrate comprises a panel and the components comprise semiconductor packages.

23. The system of claim 17 wherein the substrate comprises a leadframe and the components comprise semiconductor packages.

24. The system of claim 17 wherein the carrier is configured for placement in a burn-in oven and the test signals include burn in test signals.

25. A method for testing semiconductor components on a substrate comprising:
    providing a carrier configured to hold the substrate;
    providing a switching network on the carrier;
    applying test signals through the switching network to the components; and
    controlling the test signals using the switching network to perform a selected test on the components.

26. The method of claim 25 wherein the carrier includes an interconnect for electrically engaging the components and the switching network is contained on the interconnect.

27. The method of claim 25 wherein the test signals are configured to perform functionality testing of the components.

28. The method of claim 25 wherein the test signals are configured to perform burn-in testing of the components.

29. The method of claim 25 wherein the test signals are configured to perform functionality testing and burn-in testing of the components.

30. The method of claim 25 wherein the substrate comprises a wafer, a panel, a leadframe or a module.

31. The method of claim 25 wherein the switching network comprises a die on the carrier.

32. A method for testing semiconductor components on a substrate comprising:

providing a switching network;

applying burn-in test sign is through the switching network to the components on the substrate; and electrically isolating at east one component on the substrate during the applying step using the switching network.

33. The method of claim 32 wherein the applying step is performed using a carrier.

34. The method of claim 33 wherein the substrate comprises a panel and the carrier configured to hold the panel in a burn-in oven.

35. The method of claim 33 wherein the substrate comprises a leadframe and the carrier is configured to hold the leadframe in a burn-in oven.

36. The method of claim 33 wherein the switching network is contained on an interconnect in the carrier configured to electrically engage the components.

37. The method of claim 36 wherein the switching network comprises a die or active electrical switching devices on the interconnect.

38. The method of claim 32 further comprising applying parametric test signals through the switching network prior to he electrically isolating step.

39. A method for testing semiconductor components on a substrate comprising:

providing a switching network;

applying test signals through the switching network to the components on the substrate; and controlling the test signals using the switching network to perform a selected test on each component on the substrate.

40. The method of claim 39 wherein the selected test comprises functionality testing.

41. The method of claim 39 wherein the selected test comprises parametric testing.

42. The method of claim 39 wherein the selected test comprises burn-in testing.

43. The method of claim 39 wherein the substrate comprises a wafer and the components comprise semiconductor dice.

44. The method of claim 39 wherein the substrate comprises a panel and the components comprise semiconductor packages.

45. The method of claim 39 wherein the substrate comprises a leadframe and the components comprise semiconductor packages.

* * * * *

UNITED STATES PATENT AND TRADEMARK OFFICE
CERTIFICATE OF CORRECTION

PATENT NO. : 6,853,211 B2
DATED : February 8, 2005
INVENTOR(S) : C. Patrick Doherty, Jorge L. de Varona and Salman Akram It is certified that error appears in the above-identified patent and that said Letters Patent is hereby corrected as shown below:

Column 12,
Line 24, change "compress" to -- comprises --.

Column 13,
Line 28, after "carrier" add -- is --.

Column 14,
Line 7, change "he" to -- the --.

Signed and Sealed this

Tenth Day of May, 2005

JON W. DUDAS
*Director of the United States Patent and Trademark Office*